United States Patent [19]

Hada

[11] Patent Number: 5,640,097
[45] Date of Patent: Jun. 17, 1997

[54] TEST PATTERN FOR SEPARATELY DETERMINING PLUG RESISTANCE AND INTERFACTIAL RESISTANCE

[75] Inventor: Hiromitsu Hada, Tokyo, Japan

[73] Assignee: NEC Corporation, Japan

[21] Appl. No.: 724,350

[22] Filed: Oct. 1, 1996

Related U.S. Application Data

[62] Division of Ser. No. 541,160, Oct. 11, 1995.

[30]   Foreign Application Priority Data

Oct. 19, 1994 [JP] Japan .................................. 6-279835

[51] Int. Cl.[6] .................................................. G01R 27/08
[52] U.S. Cl. .............................................. 324/713; 324/719
[58] Field of Search .................................. 324/713, 719, 324/715, 717, 718, 722, 62

[56]   References Cited

U.S. PATENT DOCUMENTS 5,450,016  9/1995  Masumori ............................ 324/719

FOREIGN PATENT DOCUMENTS

| 0033665 | 2/1988 | Japan | 324/719 |
| 404082248 | 3/1992 | Japan | 324/719 |
| 404324951 | 11/1992 | Japan | 324/719 |
| 404359536 | 12/1992 | Japan | 324/719 |
| 405003237 | 1/1993 | Japan | 324/719 |
| 405041440 | 2/1993 | Japan | 324/719 |
| 5-129390 | 5/1993 | Japan . | |

Primary Examiner—Kenneth A. Wieder
Assistant Examiner—Thomas Valone
Attorney, Agent, or Firm—Hayes, Soloway, Hennessey, Grossman & Hage, P.C.

[57]   ABSTRACT

A test pattern for contact resistance, includes a contact hole section, and first to fourth electrode pad patterns connected to the contact hole section. The contact hole section includes first and second semiconductor region patterns apart from each other, first and second metal patterns provided above the first and second semiconductor region patterns via an insulating film apart from each other such that each of the first and second metal patterns overlaps the first and second semiconductor region patterns, first and second contact holes each having a plug structure, filled with a conductive material, and respectively provided to connect between the first semiconductor region pattern and the first and second metal patterns, the first and second contact holes having first and second depths, respectively, third and fourth contact holes each having the plug structure, filled with the conductive material, and respectively provided to connect between the second semiconductor region pattern and the first and second metal patterns, the third and fourth contact holes having the second and first depths, respectively, and fifth and sixth contact holes provided to connect between the first and second semiconductor regions patterns and the first and second electrode pad patterns, respectively, wherein the third and fourth electrode pad patterns are connected to the first and second metal patterns, respectively.

6 Claims, 6 Drawing Sheets

Fig. 9

TEST PATTERN FOR SEPARATELY DETERMINING PLUG RESISTANCE AND INTERFACTIAL RESISTANCE

This is a divisional of application Ser. No. 08/541,160 filed on Oct. 11, 1995 pending.

BACKGROUND OF THE INVENTION

1. Field of the Invention

The present invention relates to a test pattern for measuring an electric property in a semiconductor device and a test method using the test pattern, and more particularly, to a test pattern for measuring a contact resistance in a contact section and a test method using the test pattern.

2. Description of Related Art

Recently, the pattern size section in a semiconductor device becomes fine as progress of semiconductor technology. At the same time, the size of a contact hole also becomes fine. Further, an interlayer insulating film has been sufficiently planarized so that workability can be sufficiently accomplished. Conventionally, the interlayer insulating film had a hollow surface in a portion for a contact hole to have been formed. Accordingly, the depth of the contact hole was shallower by the hollow portion than the other portion of the interlayer insulating film. As described above, however, the planarization of surface is made to remove any hollow portion so that the depth of the contact hole becomes deep. As a result, since the plane size of the contact hole is also made fine, an aspect ratio of the contact hole increases abruptly. In the contact hole having such a great aspect ratio, there is typically employed a plug structure of contact in which electrically conductive material is filled in the contact hole in advance and which is covered by a metal layer, in order to prevent any break or disconnection between the conductive material and the metal layer. In this case, the contact resistance of the contact hole is composed of a plug resistance by the conductive material in the plug structure and an interfacial resistance between the conductive material and the metal layer.

When any failure is caused in the contact section, there is a case that it needs to be determined whether the cause is based on high plug resistance or high interfacial resistance. In this case, it is necessary to separately measure the plug resistance and the interfacial resistance. If the contact resistance is measured by use of a general method in the plug structure of contact, the sum of plug resistance and interfacial resistance, i.e., the contact resistance is measured. Thus, the plug resistance and interfacial resistance cannot be measured separately.

Figure 1:
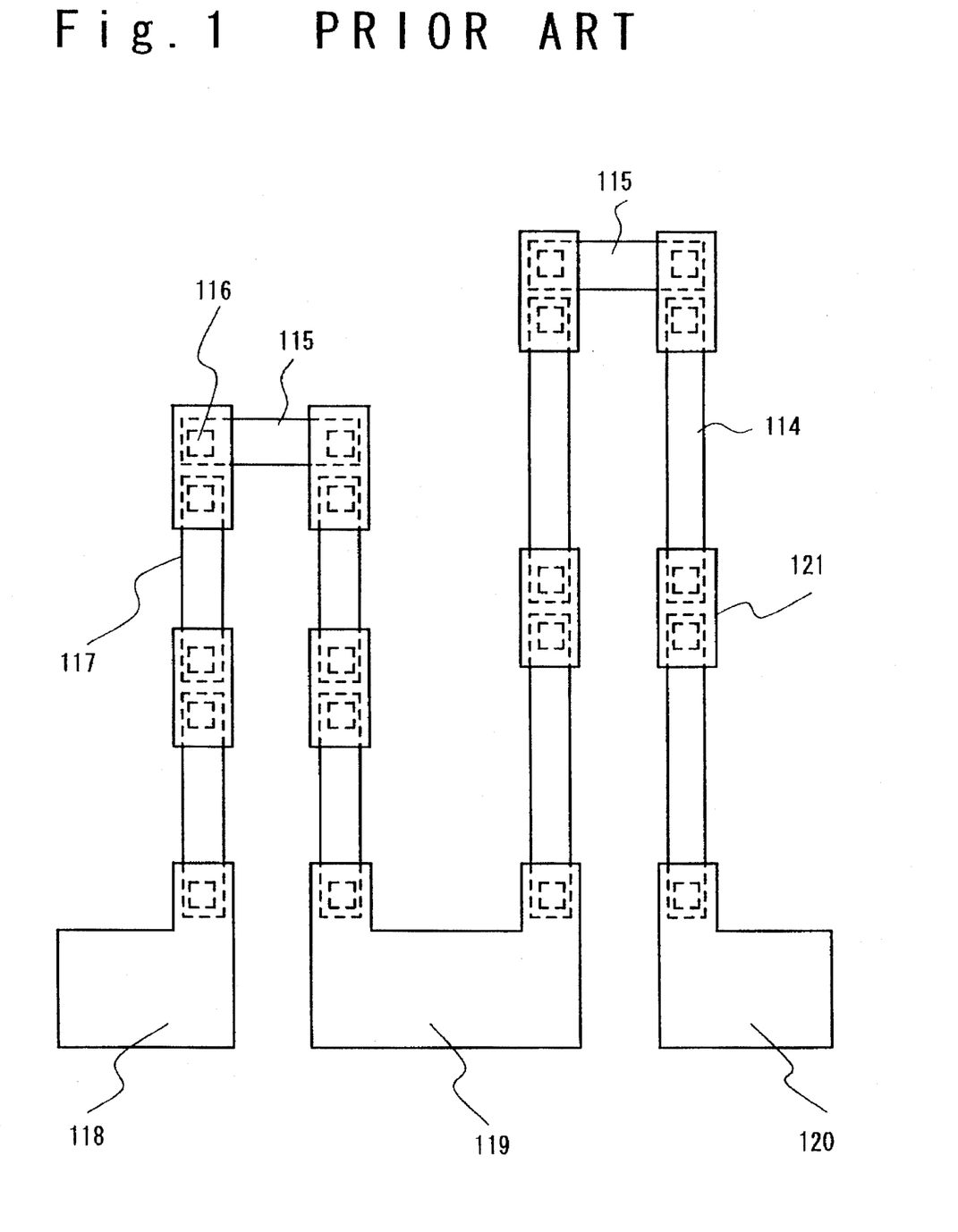
FIG. 1 is a conventional test pattern used for measuring a contact resistance.

As a check pattern for separately measuring the plug resistance and the interfacial resistance is known a pattern disclosed in Japanese Laid Open Patent Disclosure (JP-A-Heisei5-129390). This check pattern is shown in FIG. 1. Referring to FIG. 1, the check pattern includes three electrode pad patterns 118, 119 and 120 formed on an interlayer insulating film. Four n-type semiconductor wiring patterns 117 and one n-type wiring pattern 115 which are formed under the interlayer insulating film are provided in series between the electrode pad patterns 118 and 119. Contact holes 116 are provided between the electrode pad pattern and the n-type wiring pattern and between the n-type wiring patterns such that the electrode pad patterns 118 and 119 are electrically connected. Similarly, four n-type semiconductor wiring patterns 114 and one n-type wiring pattern 115 which are formed under the interlayer insulating film are provided in series between the electrode pad patterns 119 and 120.

The n-type wiring pattern 114 has the same width and depth as the wiring pattern 117 but the wiring pattern 114 is different from the wiring pattern 117 in length. Contact holes 116 all having the same size are provided between the electrode pad pattern and the n-type wiring patter and between the n-type wiring patterns such that the electrode pad patterns 119 and 120 are electrically connected.

In this check pattern, a first resistance and a second resistance are measured between the electrode pads 118 and 119 and between the electrode pads 119 and 120. As a result, a sheet resistance can be measured because the difference between the first and second resistances is based on the difference between the n-type semiconductor wiring patterns in length. Subsequently, using the resistance difference, the contact resistance can be determined precisely. In this conventional technique, however, the determined resistance is equal to the sum of the plug resistance and the interfacial resistance, i.e., the contact resistance in a case that the contact has the plug structure and the plug resistance and interfacial resistance cannot be separately measured.

Figure 2:
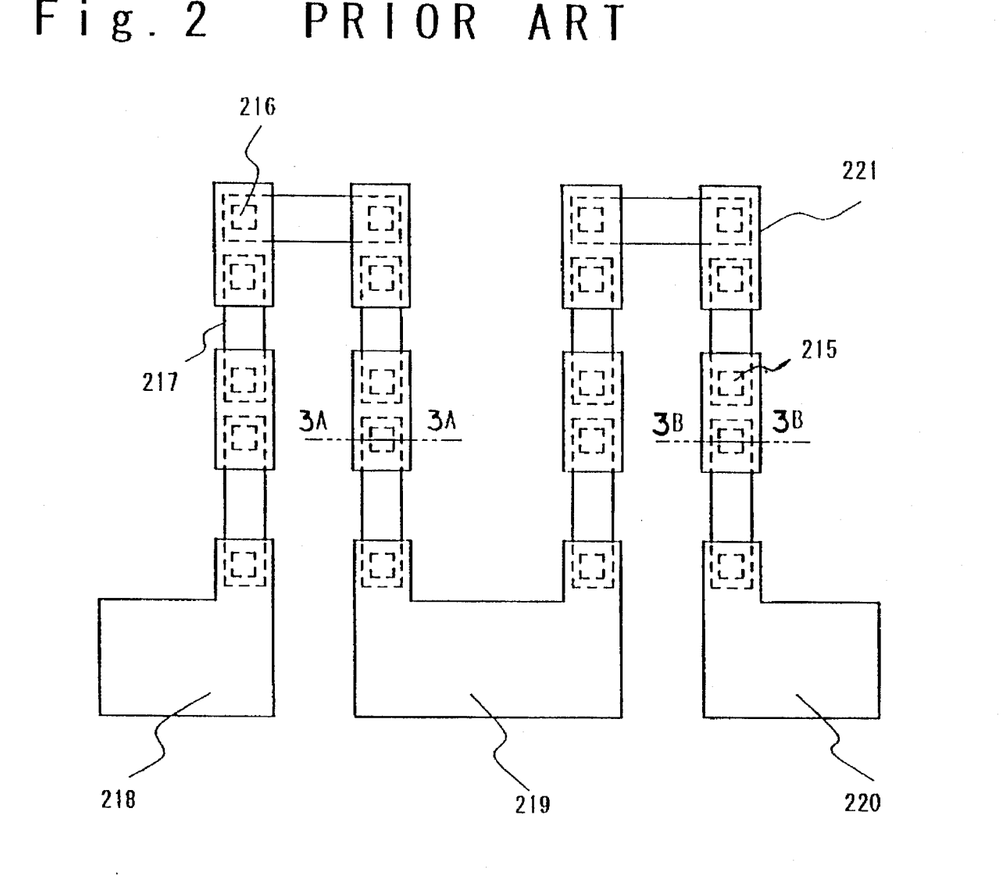
FIG. 2 is another conventional test pattern used for measuring a plug resistance and an interfacial resistance of a contact resistance.
Figure 3A:
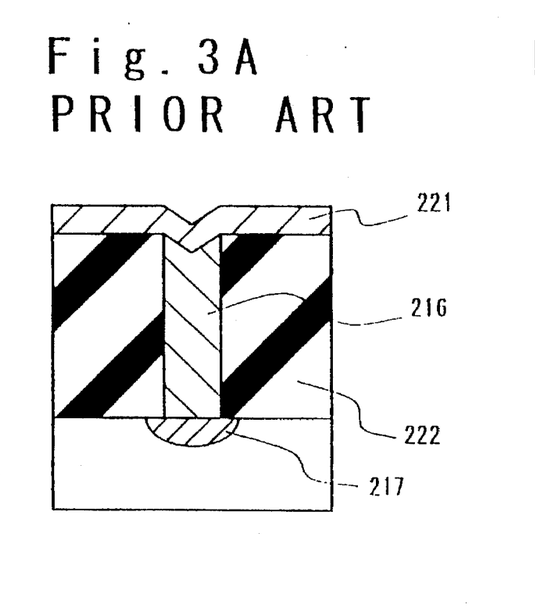
FIGS. 3A and 3B are cross sectional views when a semiconductor device is cut along an A-A' line and an B-B' line in FIG. 2, respectively.
Figure 3B:
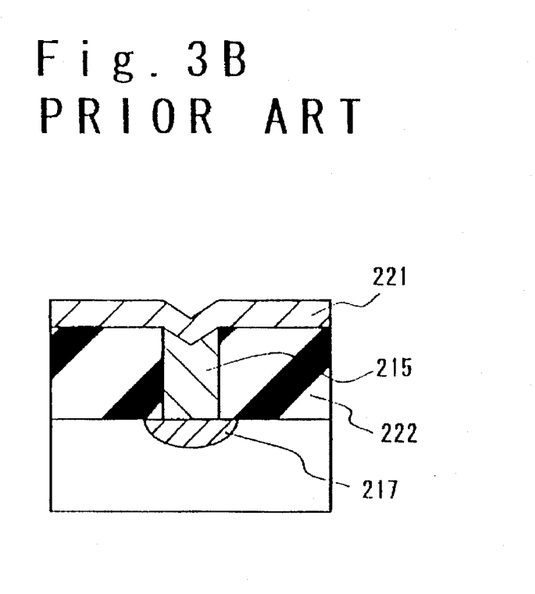

For this reason, a test pattern shown in FIG. 2 is tried in order to separately measure a plug resistance and an interfacial resistance. Referring to FIG. 2, the check pattern includes three electrode pad patterns 218, 219 and 220 formed on an interlayer insulating film. Five n-type semiconductor wiring patterns 217 having the same size and same resistance which are formed under the interlayer insulating film 222 are provided in series between the electrode pad patterns 218 and 219. Contact holes 116 are provided between the electrode pad pattern 218 or 219 and the n-type wiring pattern 217 and between the n-type wiring patterns 217 such that the electrode pad patterns 118 and 119 are electrically connected. Similarly, five n-type semiconductor wiring patterns 217 which are formed under the interlayer insulating film 222 are provided in series between the electrode pad patterns 219 and 220. Contact holes 215 all having the same size are provided between the electrode pad pattern 219 or 220 and the n-type wiring pattern 217 and between the n-type wiring patterns 217 such that the electrode pad patterns 219 and 220 are electrically connected. In this case, the cross sectional views of the contact holes 216 and 215 when a semiconductor device is cut along lines 3A—3A and 3B—3B are shown in FIGS. 3A and 3B. As seen from the figures, the contact hole 216 has the same diameter as the contact hole 215 and the contact holes 216 and 215 are filled with the same conductive material. However, the contact hole 216 is different from the contact hole 215 in depth.

In this test pattern, a first resistance and a second resistance are measured between the electrode pads 218 and 219 and between the electrode pads 219 and 220. As a result, the difference of plug resistance between the contact holes 215 and 216 can be measured. Then, an interfacial resistance can be also determined using the determined plug resistance.

However, in the above conventional technique there is the following problem. That is, in order to make it possible to measure a resistance with probes, the dimension of test pattern is about 100×100 μm. As a result, the measuring result contains an error due to ununiformity on a wafer surface.

SUMMARY OF THE INVENTION

The present invention has, as an object, to provide a test pattern for separately measuring a plug resistance and interfacial resistance of a contact resistance.

Another object of the present invention is to provide a method of separately measuring a plug resistance and interfacial resistance of a contact resistance with high precision.

In order to achieve an aspect of the present invention, a test pattern for contact resistance, includes a contact hole section, and first to fourth electrode pad patterns connected to the contact hole section. The contact hole section includes first and second semiconductor region patterns apart from each other, first and second metal patterns provided above the first and second semiconductor region patterns via an insulating film apart from each other such that each of the first and second metal patterns overlaps the first and second semiconductor region patterns, first and second contact holes each having a plug structure, filled with a conductive material, and respectively provided to connect between the first semiconductor region pattern and the first and second metal patterns, the first and second contact holes having first and second depths, respectively, third and fourth contact holes each having the plug structure, filled with the conductive material, and respectively provided to connect between the second semiconductor region pattern and the first and second metal patterns, the third and fourth contact holes having the second and first depths, respectively, and fifth and sixth contact holes provided to connect between the first and second semiconductor regions patterns and the first and second electrode pad patterns, respectively, wherein the third and fourth electrode pad patterns are connected to the first and second metal patterns, respectively.

In this case, the first and second metal pattern is desirably made of a same metal to have a same resistance and the first and second semiconductor region patterns desirably have a same impurity density. Further, the first to fourth contact holes desirably have a same cross sectional area.

In order to achieve another aspect of the present invention, a method of determining a contact resistance composed of a plug resistance and an interfacial resistance, includes the steps of:

(a) providing on a semiconductor chip a test pattern as described above;

(b) applying a predetermined voltage between the electrode pad patterns of one of a pair of first and second electrode pad patterns and a pair of third and fourth electrode pad patterns and measuring a first current flowing between the electrode pad patterns of the one pair in an open state between the electrode pad patterns of the other pair;

(c) applying the predetermined voltage between the electrode pad patterns of the one pair and measuring a second current flowing between the electrode pad patterns of the one pair and a third current flowing between the electrode pad patterns of the other pair in a short state between the electrode pad patterns of the other pair;

(d) determining a first plug resistance of the first or fourth contact hole and a second plug resistance of the second or third contact hole from the voltage and the first to third currents.

The method may further includes the steps of:

(e) measuring a first contact resistance of the first or fourth contact hole and a second contact resistance of the second or third contact hole; and (f) determining an interfacial resistance from a set of first contact resistance and first plug resistance or a set of second plug resistance and second contact resistance.

In this case, the first to fourth electrode pad patterns are desirably provided around the contact hole section. In measuring the currents, it is desirable that the one pair is of first and second electrode pads and the other pair is of third and fourth electrode pads. Alternatively, the one pair may be of third and fourth electrode pads and the other pair may be of first and second electrode pads.

In order to achieve another aspect of the present invention, a method of determining a contact resistance composed of a plug resistance and an interfacial resistance, includes the steps of:

(a) providing on a semiconductor chip a test pattern which comprises a contact hole section, and first to third electrode pad patterns provided around the contact hole section, wherein the contact hole section comprises:

a first semiconductor region pattern, first and second metal patterns provided above the first semiconductor region pattern via an insulating film apart from each other to have a same resistance such that each of the first and second metal patterns overlaps the first semiconductor region pattern, first and second contact holes each having a plug structure of a same diameter, filled with a conductive material, and respectively provided to connect between the first semiconductor region pattern and the first and second metal patterns, the first and second contact holes having first and second depths, respectively, and a third contact hole provided to connect between the first semiconductor region pattern and the first electrode pad pattern, wherein the second and third electrode pad patterns are connected to the first and second metal patterns, respectively;

(b) applying a predetermined voltage between the first and second electrode pad patterns and measuring a first current flowing between the first and second electrode pad patterns;

(c) applying the predetermined voltage between the first and third electrode pad patterns and a second current flowing between the first and third electrode pad patterns;

(d) determining a first plug resistance of the first contact hole and a second plug resistance of the second contact hole from the voltage and the first and second currents.

The method may further includes the steps of:

(e) measuring a first contact resistance of the first contact hole and a second contact resistance of the second contact hole; and (f) determining an interfacial resistance from a set of first contact resistance and first plug resistance or a set of second plug resistance and second contact resistance.

DESCRIPTION OF THE PREFERRED EMBODIMENTS

The present invention will be described below in detail with reference to the accompanying drawings.

Figure 4:
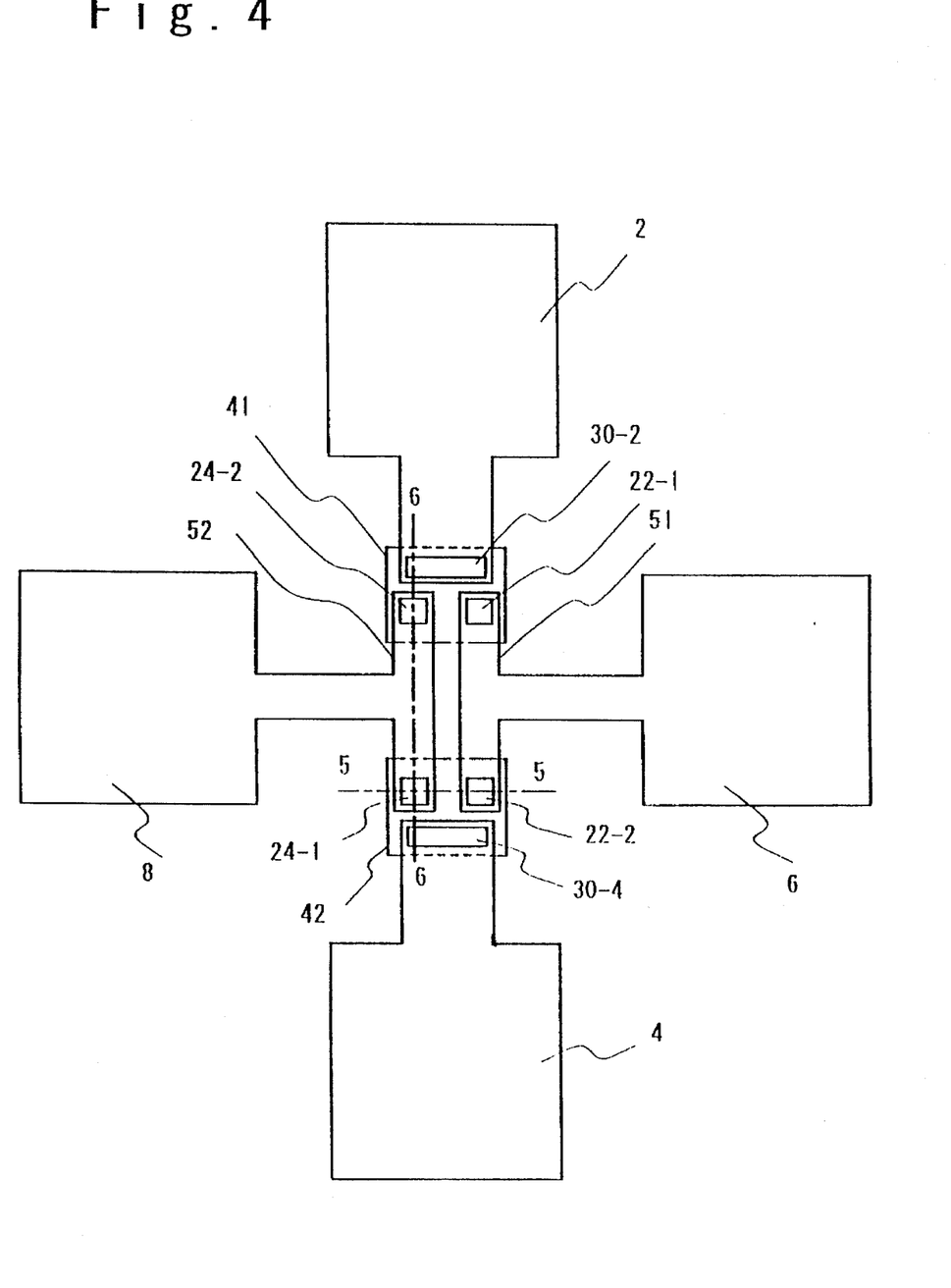
FIG. 4 is a test pattern used for measuring a contact resistance including a plug resistance and an interfacial resistance according to an embodiment of the present invention.

FIG. 4 is a diagram showing of a test pattern used in a test method of measuring a contact resistance according to an embodiment of the present invention. Referring to FIG. 4, the test pattern includes a contact hole section, and first to fourth electrode pad patterns 2, 4, 6, and 8 provided around the contact hole section such that they are connected to the contact hole section. The contact hole section includes first and second semiconductor region patterns 41 and 42 apart from each other and formed under an interlayer insulating film 20. First and second metal patterns 51 and 52 is provided above the first and second semiconductor region patterns 41 and 42 via an insulating film 20 apart from each other such that each of the first and second metal patterns 51 and 52 overlaps the first and second semiconductor region patterns 41 and 42. First and second contact holes 22-1 and 24-2 are provided in the overlapping portion to have a plug structure. The plug structure is filled with a conductive material. The first and second contact holes 22-1 and 24-2 are provided to connect between the first semiconductor region pattern 41 and the first and second metal patterns 51 and 52, respectively. The first and second contact holes 22-1 and 24-2 have first and second depths, respectively. In the embodiment, the first depth is twice more than the second depth. Third and fourth contact holes 22-2 and 24-1 having the plug structure are provided in the overlapping portion of the semiconductor region pattern 42 and the first and second metal patterns 51 and 52, and filled with the conductive material such that the contact holes 22-2 and 24-1 are provided to connect between the second semiconductor region pattern 42 and the first and second metal patterns 51 and 52. The third and fourth contact holes 22-1 and 24-1 have the second and first depths, respectively. Fifth and sixth contact holes 30-2 and 30-4 are provided to connect between the first and second semiconductor region patterns 41 and 42 and the first and second electrode pad patterns 2 and 4, respectively. The third and fourth electrode pad patterns 6 and 8 are symmetrically connected to the first and second metal patterns 51 and 52, respectively. In this case, the first and second metal patterns are desirably made of a same metal to have a same resistance and the first and second semiconductor region patterns desirably have a same impurity density. The first to fourth contact holes 22-1, 22-2, 24-1 and 24-2 have the same cross sectional area. In the embodiment, the contact holes 22-1 and 24-2 are provided with a distance less than 5 μm.

Figure 5:
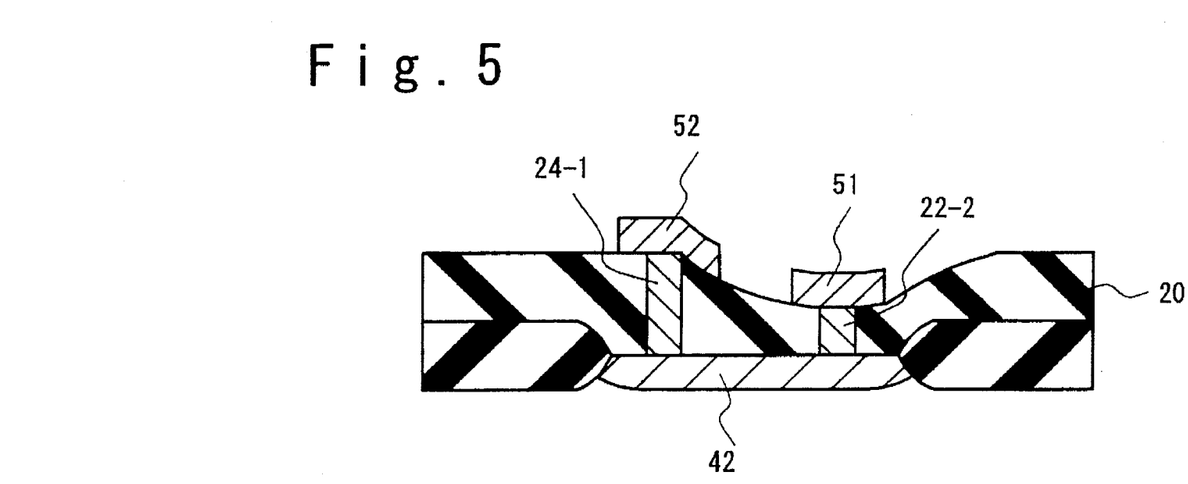
FIG. 5 is a cross sectional view when a semiconductor device shown in FIG. 4 is cut along a V—V line.
Figure 6:
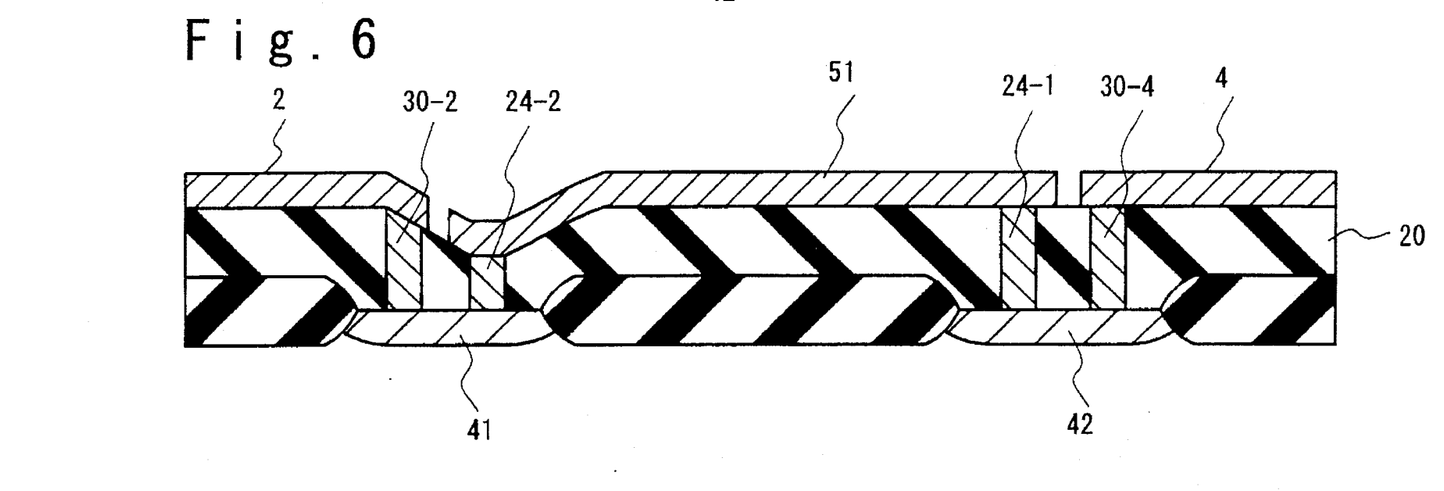
FIG. 6 is a cross sectional view when a semiconductor device shown in FIG. 4 is cut along a VI—VI line.

FIGS. 5 and 6 show cross sectional views of the semiconductor device when it is cut along lines 5—5 and 6—6, respectively. As seen from the figures, the contact holes 22-1, 22-2 24-1 and 24-2 have the same diameter and the first depth of the contact holes 22-1 and 24-1 is twice more than the second depth of the contact holes 22-2 and 24-2.

Figure 7:
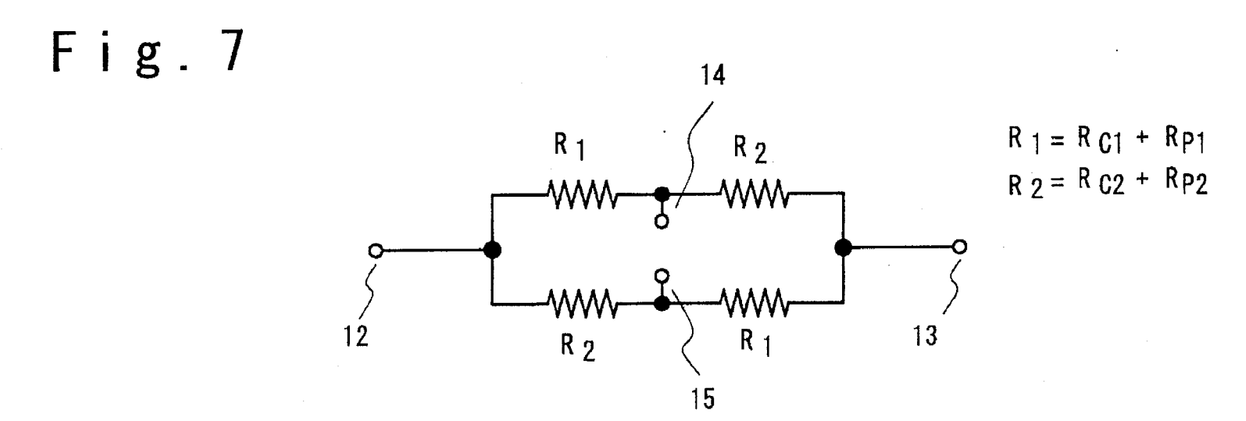
FIG. 7 is an equivalent circuit of the test pattern shown in FIG. 4.

FIG. 7 is a diagram showing an equivalent circuit of the test pattern shown in FIG. 4. Any parasitic resistance is not taken into account. Referring to the FIG. 7, the equivalent circuit will be described below. In FIG. 7, a sum of a plug resistance $R_{P1}$ and interfacial resistance $R_{C1}$ in the contact hole having the first depth (the contact hole 22-1 or 24-1 in FIG. 4) is represented by $R_1$ (=$R_{C1}+R_{P1}$). A sum of plug resistance $R_{P2}$ and interfacial resistance $R_{C2}$ in the contact hole having the second depth (the contact hole 22-2 or 24-2 in FIG. 4) is represented by $R_2$ (=$R_{C2}+R_{P2}$). A first terminal 12 and a second terminal 13 correspond to the electrode pads 6 and 8, respectively. A third terminal 14 and a fourth terminal 15 correspond to the electrode pads 2 and 4, respectively.

In FIG. 7, in an open state between the third and fourth terminals 14 and 15, a current $I_O$ flowing between the first and second terminals is first measured when a voltage V is applied between the first and second terminals 12 and 13. Subsequently, in a short state between the third and fourth terminals 14 and 15, a current $I_B$ flowing between the third and fourth terminals 14 and 15 and a current $I_S$ flowing between the first and second terminals 12 and 13 are measured when the voltage V is applied between the first and second terminals 12 and 13 in the same manner as described above. In this case, the following relation is obtained.

$$R_1-R_2=(2V/I_B)\{1-(I_S/I_O)\} \quad (1)$$

In this embodiment, $R_{C1}=R_{C2}$ is satisfied because the interfacial resistances are the same if the interfacial states are same. Accordingly, the following equation is satisfied.

$$R_1-R_2=(2V/I_B)\{1-(I_S/I_O)\}=R_{P1}-R_{P2} \quad (2)$$

Further, the plug resistances of the contact holes 22-1 and 22-2 are represented by $$R_{P1}=\rho_1(d_1/S_1), R_{P2}=\rho_2(d_2/S_2)$$

where $\rho_1$ and $\rho_2$ are resistivity of the conductive material filled in the contact holes 22-1 or 24-1 and 22-2 or 24-2, respectively, $S_1$ and $S_2$ are cross sectional area of the contact holes 22-1 or 24-1 and 22-2 or 24-2, and $d_1$ and $d_2$ are contact depth of the contact holes 22-1 or 24-1 and 22-2 or 24-2, are first depth and second depth in the embodiment. In this embodiment, since $\rho_1=\rho_2=\rho$, $S_1=S_2=S$, and $d_1=2d_2$, the following equation (3) can be obtained.

$$R_{P1}-R_{P2}=(\rho/S)(d_1-d_2)=(\rho/S)(2d_2-d_2)=(\rho/S)d_2=R_{P2} \quad (3)$$

Therefore, the plug resistance $R_{P2}$ can be obtained using the voltage V, the currents $I_O$, $I_B$ and $I_S$ as follows.

$$R_{P2}=(2V/I_B)\{1-(I_S/I_O)\}$$

Next, the contact resistances $R_1$ and $R_2$ are measured and determined. The contact resistances $R_1$ and $R_2$ can be easily measured. In order to measure the contact resistances $R_1$ and $R_2$, the method shown in FIG. 1 may be used or another method may be used. If the contact resistances $R_1$ and $R_2$ are measured, the interfacial resistance $R_{C1}$ (=$R_{C2}$) can be determined from the following equations.

$$R_{C1}=R_1-R_{P1}=R_1-2R_{P2}$$

$$R_{C2}=R_2-R_{P2}$$

Next, the method of separately measuring the plug resistance and interfacial resistance according to the second embodiment of the present invention will be described.

Figure 8:
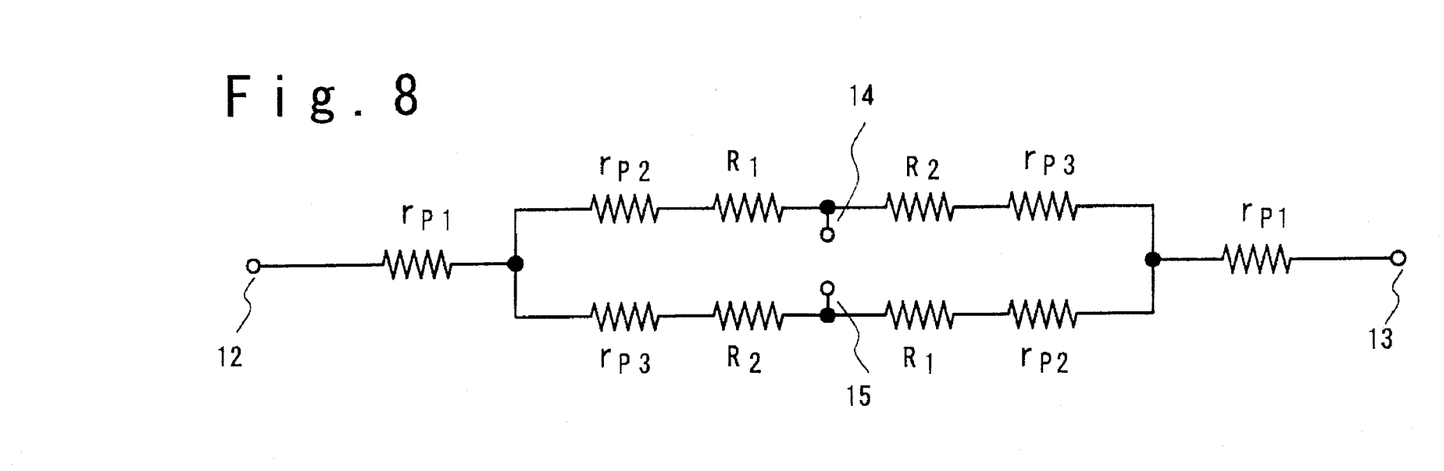
FIG. 8 is an equivalent circuit of the test pattern shown in FIG. 4 including a parasitic resistance.

In the above first embodiment, a parasitic resistance such as a diffusion layer resistance and a wiring pattern resistance is not taken into account. When such parasitic resistance is taken into account, the equivalent circuit is as shown in FIG. 8. In FIG. 8, resistors $r_{PX}$ (X=1 to 3) represent parasitic resistances. In this case, the following equation is established.

$$(R_1+r_{P2})-(R_2+r_{P3})=(2V/I_B)\{1-(I_S/I_O)\}$$

In the embodiment, $r_{P2}=r_{P3}$ because the test pattern is symmetric. Accordingly, the above equation (1) is satisfied. As a result, even if any parasitic resistance is present, it does not influence to the measuring result.

Next, the method of separately measuring the plug resistance and interfacial resistance according to the third embodiment of the present invention will be described. In this embodiment, the terminals 12 and 13 correspond to the electrode pads 2 and 4 and the terminals 14 and 15 correspond to the electrode pads 6 and 8. The currents $I_O$, $I_S$, and $I_B$ are measured in the same manner as described in the first embodiment. Therefore, the plug resistance and interfacial resistance can be separately determined.

In the third embodiment, the electrode pads 6 and 8 are directly connected to the contact holes 22-1 and 22-2, and 24-1 and 24-2, i.e., the contact holes having the first depth and having the second depth. In the first embodiment, for instance, the electrode pad 2 is connected to the contact holes 22-1 and 24-2 via the contact hole 30-2 and the semiconductor region 41. The resistance of the metal wiring pattern, the contact resistance of the contact hole 30-2, and the resistance of the semiconductor region 41 function as a parasitic resistance which is connected to the contact holes 22-1 and 24-2 in series. The parasitic resistance is equivalently present between the terminals 14 and 15 when the currents $I_O$, $I_S$ and $I_B$. Therefore, the parasitic resistance cannot be cancelled, resulting in measuring error. On the other hand, the third embodiment, since the electrode pads 6 and 8 are directly connected to the contact holes as described above, the parasitic resistance can be cancelled. Therefore, the lug resistance and interfacial resistance can be separately measured with higher precision than in the first embodiment.

As described above, accordingly to the present invention, the contact holes 22-1 and 24-2 can be formed with a distance less than 5 μm. As a result, measuring error due to ununiformity on the wafer surface can be avoided. Further, the plug resistance and interfacial resistance can be separately measured with high precision without influence by any parasitic resistance.

Figure 9:
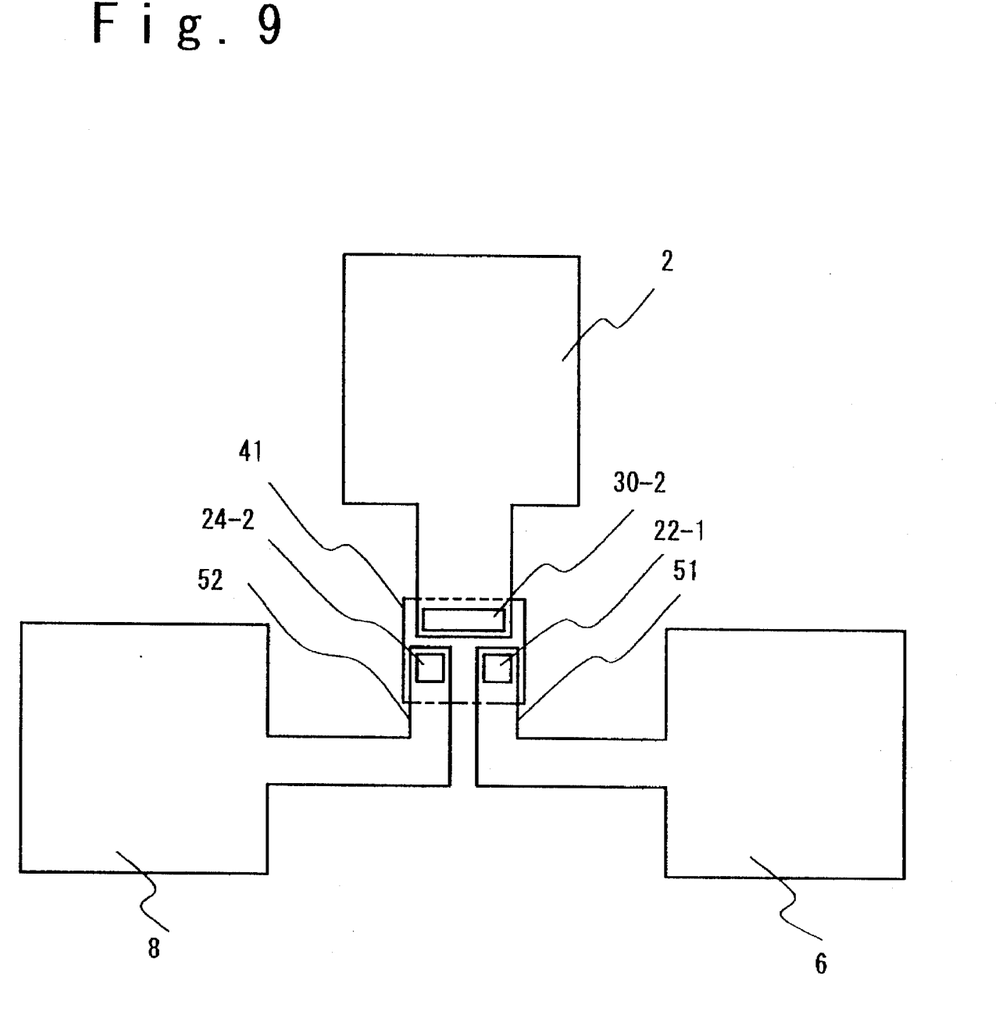
FIG. 9 is another test pattern used for measuring a contact resistance including a plug resistance and an interfacial resistance according to another embodiment of the present invention.

Next, the method of separately measuring the plug resistance and interfacial resistance according to the fourth embodiment of the present invention will be described. In this embodiment, an upper half of the test pattern shown in FIG. 4 is used as shown in FIG. 9. The measuring method is the same as the method shown in FIG. 2. In this case, the plug resistance can be directly measured without any error due to ununiformity on the wafer surface although the precision is lower than in the first to third embodiments because the bridge circuit is not used.

What is claimed is:

1. A test pattern for contact resistance, comprising:

a contact hole section; and first to fourth electrode pad patterns provided around said contact hole section, and wherein said contact hole section comprises:

first and second semiconductor region patterns apart from each other;

first and second metal patterns provided above said first and second semiconductor region patterns via an insulating film apart from each other such that each of said first and second metal patterns overlaps said first and second semiconductor region patterns;

first and second contact holes each having a plug structure, filled with a conductive material, and respectively provided to connect between said first semiconductor region pattern and said first and second metal patterns, said first and second contact holes having first and second depths, respectively;

third and fourth contact holes each having the plug structure, filled with the conductive material, and respectively provided to connect between said second semiconductor region pattern and said first and second metal patterns, said third and fourth contact holes having said second and first depths, respectively; and fifth and sixth contact holes provided to connect between said first and second semiconductor regions patterns and said first and second electrode pad patterns, respectively, wherein said third and fourth electrode pad patterns are connected to said first and second metal patterns, respectively.

2. A test pattern according to claim 1, wherein said first and second metal pattern is made of a same metal to have a same resistance.

3. A test pattern according to claim 1, wherein said first to fourth contact holes have a same cross sectional area.

4. A test pattern according to claim 1, wherein said first and second semiconductor region patterns have a same impurity density.

5. A test pattern according to claim 1, wherein said first depth is twice more than said second depth.

6. A test pattern according to claim 1, wherein said third and fourth electrode pad patterns are symmetrically connected to said first and second metal patterns.

* * * * *